(12) United States Patent
Zhong et al.

(10) Patent No.: US 11,293,942 B2
(45) Date of Patent: Apr. 5, 2022

(54) SUPERCONDUCTING TAPE TESTING DEVICE

(71) Applicants: GUANGDONG POWER GRID CO., LTD., Guangdong (CN); ELECTRIC POWER RESEARCH INSTITUTE OF GUANGDONG POWER GRID CO., LTD., Guangdong (CN)

(72) Inventors: Lianhong Zhong, Guangdong (CN); Xinhui Duan, Guangdong (CN); Meng Song, Guangdong (CN); Chao Sheng, Guangdong (CN); Yongfa Zhao, Guangdong (CN); Bing Zhao, Guangdong (CN); Li Li, Guangdong (CN); Yunsong Luo, Guangdong (CN); Yajun Xia, Guangdong (CN); Wenfeng Cheng, Guangdong (CN); Zhengjun Shi, Guangdong (CN); Youxin Lin, Guangdong (CN)

(73) Assignees: Guangdong Power Grid Co., Ltd., Guangdong (CN); Electric Power Research Institute of Guangdong Power Grid Co., Ltd., Guangdong (CN)

( * ) Notice: Subject to any disclaimer, the term of this patent is extended or adjusted under 35 U.S.C. 154(b) by 0 days.

(21) Appl. No.: 16/972,525

(22) PCT Filed: Aug. 30, 2019

(86) PCT No.: PCT/CN2019/103704
§ 371 (c)(1),
(2) Date: Dec. 4, 2020

(87) PCT Pub. No.: WO2020/093772
PCT Pub. Date: May 14, 2020

(65) Prior Publication Data
US 2021/0270867 A1 Sep. 2, 2021

(30) Foreign Application Priority Data

Nov. 9, 2018 (CN) .......................... 201811333142.4

(51) Int. Cl.
*G01R 1/04* (2006.01)
*G01R 33/12* (2006.01)

(52) U.S. Cl.
CPC ....... *G01R 1/0408* (2013.01); *G01R 33/1238* (2013.01)

(58) Field of Classification Search
CPC .......................... G01R 1/0408; G01R 33/1238
See application file for complete search history.

(56) References Cited

U.S. PATENT DOCUMENTS

| 6,449,167 B1 * | 9/2002 | Seymour | G01R 1/0408 335/205 |
| 10,962,568 B2 * | 3/2021 | Shuto | G01R 1/06 |
| 2002/0104212 A1 | 8/2002 | Ladd et al. | |

FOREIGN PATENT DOCUMENTS

| CN | 203658405 | 6/2014 |
| CN | 107238737 | 10/2017 |

(Continued)

OTHER PUBLICATIONS

English Translation of CN 108181352 A (Year: 2018).*
(Continued)

*Primary Examiner* — Paresh Patel
(74) *Attorney, Agent, or Firm* — Michael Best & Friedrich LLP

(57) ABSTRACT

Provided is a superconducting tape testing device, including lead contacts and a support plate. Each lead contact a conductive contact and a magnet; the magnet is provided with a through hole through which the conductive contact passes, the support plate comprises a plate and a magnetic (Continued)

conductive member; and the magnetic conductive member is fixed on the surface of the plate body.

8 Claims, 3 Drawing Sheets

(56) References Cited

FOREIGN PATENT DOCUMENTS

| | | |
|---|---|---|
| CN | 108181352 | 6/2018 |
| JP | 6481242 | 3/1989 |
| JP | 11183573 | 7/1999 |
| JP | 2000275274 | 10/2000 |
| JP | 2012080047 | 4/2012 |
| TW | 306330 | 2/2007 |

OTHER PUBLICATIONS

English Translation of JPH 11183573 A (Year: 1999).*
English Translation of CN 203658405 U (Year: 2014).*
English Translation of PCT/CN2019/103704 (Year: 2019).*
PCT/CN2019/103704 International Search Report dated Nov. 28, 2019.

* cited by examiner

SUPERCONDUCTING TAPE TESTING DEVICE

CROSS-REFERENCES TO RELATED APPLICATIONS

This is a National Stage Application, filed under 35 U.S.C. 371, of International Patent Application No. PCT/CN2019/103704, filed on Aug. 30, 2019, which is based on and claims priority to Chinese patent application No. 201811333142.4 filed on Nov. 9, 2018, disclosure of which is incorporated herein by reference in its entirety.

TECHNICAL FIELD

The present application relates to the field of superconducting tape testing and in particular, to a superconducting tape testing device.

BACKGROUND

The superconductor is a new type of material having extremely low resistance at a certain low temperature. After more than 20 years of development, high-temperature superconducting tapes represented by Bismuth strontium calcium copper oxide (BSCCO) and Yttrium barium copper oxide (YBCO) have been commercially mass produced, and have been widely used in the field of equipment such as superconducting power cables, superconducting fault current limiters and superconducting magnets. In laboratory research or actual superconducting power equipment, experimental test items such as the critical current, AC loss, current impact and other properties of the superconducting tape all require measuring a potential per unit length of the superconducting tape.

The conventional method is to weld two potential leads on a superconducting tape and measure the difference potential between the two points and the distance between the two welding points to obtain the potential per unit length. The conventional method of welding potential leads has the advantages of simple equipment and reliable contact, but there are also problems such as large uncertainty in the measurement of the distance between the welding points and irreversible damage caused by welding points to the superconducting tape.

SUMMARY

The present application is intended to provide a superconducting tape testing device, so that the superconducting tape can be tested accurately without causing damage to the superconducting tape.

In view of the above, the present application provides a superconducting tape testing device.

The superconducting tape testing device includes lead contacts and a support plate.

The lead contacts are configured to fix the superconducting tape and measure a potential.

The support plate is configured to cooperate with the lead contacts to fix the superconducting tape.

Optionally, each of the lead contacts includes a magnet and a conductive contact.

The magnet is provided with a through hole through which the conductive contact passes.

The conductive contact passes through the through hole and contacts the superconducting tape.

Optionally, the support plate includes: a plate serving as a main body structure of the testing device; and a magnetic conductive member which is fixed on the surface of the plate.

Optionally, the lead contacts each further include an insulation sleeve, and the insulation sleeve is fixed between the through hole and the conductive contact.

Optionally, an end surface of the conductive contact in contact with a superconducting tape to be tested is a spherical surface, and the spherical surface of the conductive contact is provided with a conductive layer.

Optionally, the plate is provided with a mounting slot for mounting the magnetic conductive member.

Optionally, a mounting surface of the mounting slot is circular.

Optionally, the magnetic conductive member is a cylindrical structure.

Optionally, the magnet has a cylindrical structure.

Optionally, a chamfer is machined on a portion of the magnet between a side face of the magnet and a contact surface where the magnet contacts the superconducting tape to be tested.

Compared with the existing art, the embodiments of the present application has the following advantages.

The embodiments of the present application provide a superconducting tape testing device including lead contacts and a support plate. The lead contacts each is composed of a conductive contact and a magnet, and the support plate is composed of a plate and a magnetic conductive member. When the superconducting tape is to be measured, the superconducting tape is placed on the support plate, and the lead contacts are placed on the superconducting tape. Through the magnetic attraction force between the magnet and the magnetic conductive member, the lead contacts and the superconducting tape closely contact with each other and achieve electrical conduction. Two lead contacts and corresponding magnetic conductive members are arranged per unit length, which can achieve the measurement of the potential per unit length of the superconducting tape.

Compared with the existing art, the superconducting tape testing device provided by the present application has the advantages of simple structure and reliable contact, and the lead contacts are connected to the superconducting tape through a magnetic attraction force, the distance between two lead contacts can be adjusted conveniently and quickly, and no damage to the superconducting tape would be caused, thus solving the problems in the existing art of large uncertainty of the measurement of the distance between welding points and irreversible damage caused by welding points to the superconducting tape due to welding, thereby increasing measurement efficiency and precision.

BRIEF DESCRIPTION OF DRAWINGS

To illustrate the solutions in specific embodiments of the present application or the solutions in the existing art more clearly, drawings used in the description of the specific embodiments or the existing art will be briefly described below. Apparently, the drawings described below illustrate part of the embodiments of the present application, and those of ordinary skill in the art may obtain other drawings based on the drawings described below on the premise that no creative work is done.

REFERENCE LIST

1 conductive contact; 2 insulation sleeve; 3 magnet; 4 plate; 5 magnetic conductive member.

DETAILED DESCRIPTION

The solutions of the present application will be described clearly and completely in conjunction with drawings. Apparently, the embodiments described are part, not all, of the embodiments of the present application. Based on the embodiments in the present application, all other embodiments obtained by those of ordinary skill in the art without creative work are within the scope of the present application.

In the description of the present application, it is to be noted that orientations or position relations indicated by terms such as "center", "upper", "lower", "left", "right", "vertical", "horizontal", "in", "out" are orientations or position relations based on the drawings. These orientations or position relations are intended only to facilitate the description of the present application and simplify the description and not to indicate or imply that a device or element referred to must have such specific orientations or must be configured or operated in such specific orientations. Thus, these orientations or position relations are not to be construed as limiting the present application. In addition, terms such as "first", "second" and "third" are used merely for the purpose of description and are not to be construed as indicating or implying relative importance.

Unless otherwise expressly specified and limited, terms like "mounted", "connected to each other", "connected" are to be construed in a broad sense, for example, as permanently connected, detachably connected, or integrated; mechanically connected, or electrically connected; directly connected, or indirectly connected via an intermediary; or intraconnected between two components. For those of ordinary skill in the art, the above terms can be construed according to specific circumstances in the present application.

Figure 1:
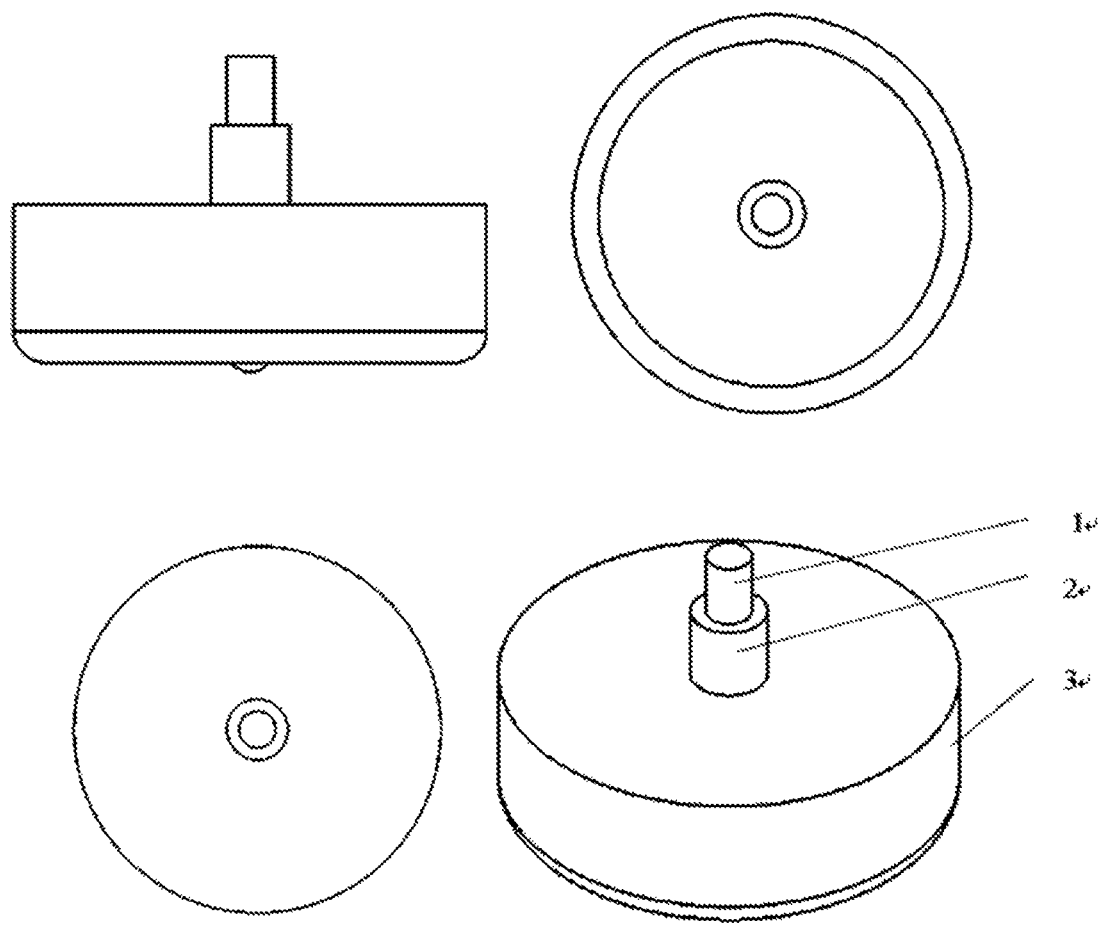
FIG. 1 is a structural view of a conductive contact of a superconducting tape testing device according to an embodiment of the present application.
Figure 2:
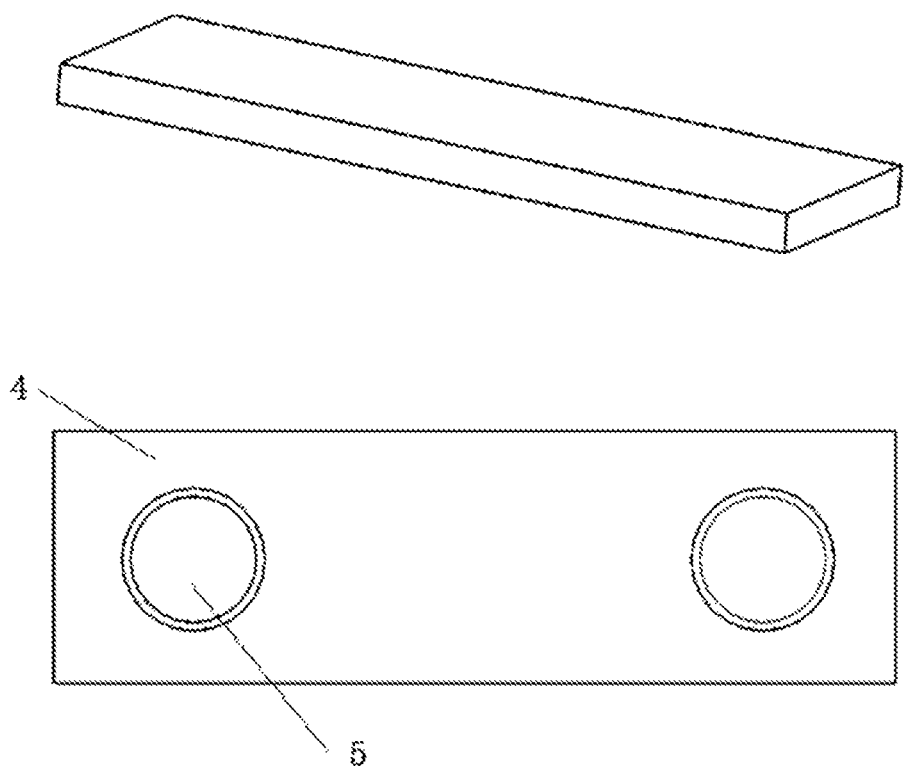
FIG. 2 is a structural view of a support plate of the superconducting tape testing device according to an embodiment of the present application.

Referring to FIGS. 1 and 2, FIG. 1 is a structural view of a conductive contact of a superconducting tape testing device according to an embodiment of the present application, and FIG. 2 is a structural view of a support plate of the superconducting tape testing device according to an embodiment of the present application.

The present application designs a superconducting tape testing device including lead contacts and a support plate. The lead contacts are configured to fix the superconducting tape and measure a potential, and the support plate is configured to cooperate with the lead contacts to fix the superconducting tape.

Each of the lead contacts each includes a conductive contact 1 and a magnet 3. The magnet 3 is provided with a through hole through which the conductive contact 1 passes. The conductive contact 1 passes through the magnet 3, and a first terminal of the conductive contact 1 is a connection terminal that can be configured to connect a test lead, and a second terminal is a contact that can be configured to contact the superconducting tape to be tested. It is to be understood that, in order to satisfy both the magnetic attraction force requirements and the effects of connection to the superconducting tape, the contact of the conductive contact 1 can slightly protrude from the surface of the magnet 3. In order to connect the test lead more conveniently, the connection terminal of the conductive contact 1 can be reserved for more space.

The support plate includes a plate 4 and a magnetic conductive member 5. The magnetic conductive member 5 is fixed on the surface of the plate 4.

It is to be noted that the magnetic conductive member 5 and the magnet 3 have the magnetic attraction force. The magnet 3 may be a permanent magnet, the magnetic conductive member 5 may be a high-permeability material such as soft iron, and the plate 4 may be a conventional epoxy support plate. When the potential per unit distance length of the superconducting tape needs to be measured, merely two magnetic conductive members 5 need to be fixed at the two ends of the preset unit distance length on the plate 4 respectively. During the testing, the superconducting tape is placed on one side of the plate 4, the magnetic conductive member 5 is fixed on the other side of the plate 4, the contact of the conductive contact 1 contacts the superconducting tape to be tested, and the magnets 3 of the two lead contacts and respective magnetic conductive members 5 at two positions are magnetically attracted to the superconducting tape and the contacts. The positions of the two contacts are slightly adjusted, and after the two contacts are stable, subsequent steps of measurement are performed.

By fixing the magnetic conductive members 5 at different positions on the plate 4, the superconducting tapes of different unit lengths can be measured according to experimental requirements, and the measurement conditions are more flexible.

The superconducting tape testing device provided by the present application presses the conductive contact 1 against the surface of the superconducting tape by using the magnetic attraction force of the strong magnetism of the magnet 3 to the magnetic conductive member 5 to draw out the potential signal, and in the process of testing, the contact is reliable and operations are easy to carry out. Compared with the welding method in the existing art, the superconducting tape testing device provided by the present application has advantages of simple structure, uncomplicated manufacturing process, small uncertainty in distance measurement and high measurement efficiency, solving the problem in the existing art of irreversible damage caused by welding points to the superconducting tape due to welding.

Furthermore, in order to avoid the occurrence of a current between the conductive contact 1 and the magnet 3 and to ensure that the electrical signal of the potential lead only comes from the conductive contact 1, electrical insulation treatment can be performed on the surface where the conductive contact 1 contacts the magnet 3. A preferred manner is to add an insulation sleeve 2 between the conductive contact 1 and the magnet 3. The insulation sleeve 2 may be specifically an epoxy insulation sleeve. It is to be understood that the insulation sleeve 2 has a hollow structure, and the inner side of the insulation sleeve 2 matches the outer side of the conductive contact 1 in size, and the outer side of the insulation sleeve 2 matches the through hole of the magnet 3 in size. The arrangement position of the insulation sleeve 2 can be that one end of the insulation sleeve 2 on the contact of the conductive contact 1 is flush with the surface of the magnet 3, and the other end is slightly higher than the surface of the magnet 3.

Furthermore, in order to achieve the point contact with the superconducting tape and improve the measurement precision, the contact of the conductive contact 1 can be machined into a curved surface. When the conductive contact 1 has a cylindrical structure, the contact of the conductive contact 1 can be specifically machined to be spheroidal or spherical surface.

Furthermore, in order to achieve better contact effects, surface treatment can further be performed on the contact of the conductive contact 1, for example, the contact can be provided with a conductive layer which may be a metal layer plated with gold, indium, or the like.

Furthermore, in order to better mount the magnetic conductive member 5 on the plate 4, a mounting slot for mounting the magnetic conductive member 5 can be machined on the plate 4.

It is to be understood that the mounting slot should be sized to mate with the magnetic conductive member 5 so that the magnetic conductive member 5 is fixed or embedded in the plate 4.

Furthermore, the mounting slot may have a circular mounting surface, and the magnetic conductive member 5 may also have a cylindrical structure. Meanwhile, in order to obtain better contact effects, the magnet 3 can also be a hollow cylindrical structure that matches the shape of the magnetic conductive member 5. When the magnet 3 is a hollow cylindrical structure, the conductive contact 1 is also a cylindrical structure and an insulation sleeve 2 having a hollow cylindrical structure is provided between the magnet 3 and the conductive contact 1. A preferred position relationship is that the magnet 3, the conductive contact 1 and the insulation sleeve 2 are of a concentric structure.

Furthermore, a chamfer can be machined on a portion of the magnet between a side face of the magnet 3 and a contact surface where the magnet 3 contacts the superconducting tape to be tested, and specifically the chamfer can be machined into a round chamfer. In one aspect, the chamfer can be used for distinguishing between the contact and the connection end of the conductive contact 1, and in another aspect, the chamfer helps to separate the magnet 3 from the superconducting tape after the testing on the superconducting tape is complete.

Figure 3:
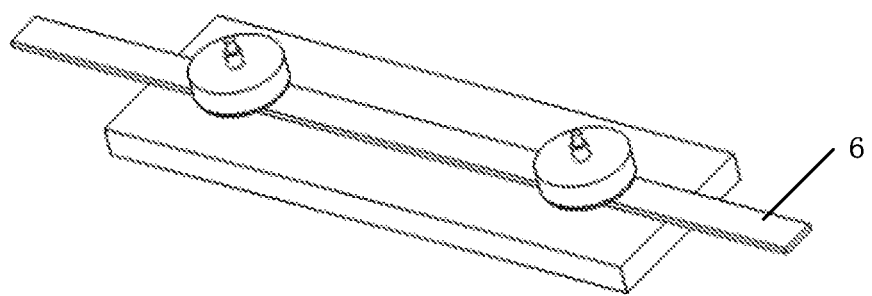
FIG. 3 is a schematic view of a measurement method of the superconducting tape testing device according to an embodiment of the present application.

FIG. 3 is a schematic view of a measurement method of the superconducting tape testing device according to an embodiment of the present application.

When the critical current, AC loss, current impact and other properties of the superconducting tape 6 are to be measured, the superconducting tape 6 is horizontally placed on the support plate, and after two lead contacts are placed on the superconducting tape 6, the magnetic attraction force closely attracts the superconducting tape 6 and the contacts. The positions of the contacts are slightly adjusted, and after the contacts are stable, the superconducting tape 6 can be placed in a low-temperature environment and then measured.

Finally, it is to be noted that the above-mentioned embodiments are only used to explain the solutions of the present application and shall not be construed as limitation thereto; although detailed descriptions have been made about the present application by referring to the above-mentioned embodiments, those of ordinary skill in the art shall be understood: modifications can be made on the solutions of the present application, or equivalent substitutions can be made on part or all of the technical features of the present application; such modifications or substitutions do not make the corresponding solution depart from the scope of the solutions of the embodiments in the present application.

What is claimed is:

1. A superconducting tape testing device, comprising:
   lead contacts, which are configured to fix a superconducting tape to be tested and measure a potential; and
   a support plate, which is configured to cooperate with the lead contacts to fix the superconducting tape to be tested;
   wherein each of the lead contacts comprises: a magnet and a conductive contact
      wherein the magnet is provided with a through hole through which the conductive contact passes; and the conductive contact passes through the through hole and contacts the superconducting tape to be tested;
   wherein the support plate comprises: a plate serving as a main body structure of the testing device; and a magnetic conductive member which is fixed on a surface of the plate.

2. The device of claim 1, wherein
   the each of the lead contacts further comprises an insulation sleeve; and
   the insulation sleeve is fixed between the through hole and the conductive contact.

3. The device of claim 1, wherein
   an end surface of the conductive contact in contact with the superconducting tape to be tested is a spherical surface; and
   the spherical surface of the conductive contact is provided with a conductive layer.

4. The device of claim 1, wherein
   the plate is provided with a mounting slot for mounting the magnetic conductive member.

5. The device of claim 4, wherein
   the mounting slot has a circular mounting surface.

6. The device of claim 5, wherein
   the magnetic conductive member has a cylindrical structure.

7. The device of claim 1, wherein
   the magnet has a cylindrical structure.

8. The device of claim 1, wherein
   a chamfer is machined on a portion of the magnet between a side face of the magnet and a contact surface where the magnet contacts the superconducting tape to be tested.

\* \* \* \* \*